(12) United States Patent
Wang

(10) Patent No.: US 12,009,237 B2
(45) Date of Patent: *Jun. 11, 2024

(54) SEQUENCER TIME LEAPING EXECUTION

(71) Applicant: Applied Materials, Inc., Santa Clara, CA (US)

(72) Inventor: Chongyang Wang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/902,688

(22) Filed: Sep. 2, 2022

(65) Prior Publication Data

US 2022/0415682 A1    Dec. 29, 2022

Related U.S. Application Data

(63) Continuation of application No. 16/911,244, filed on Jun. 24, 2020, now Pat. No. 11,437,254.

(51) Int. Cl.
*H01L 21/67* (2006.01)
*G05B 19/418* (2006.01)

(52) U.S. Cl.
CPC .... *H01L 21/67276* (2013.01); *G05B 19/4187* (2013.01); *G05B 19/41875* (2013.01)

(58) Field of Classification Search
CPC ........ H01L 21/67276; H01L 21/67745; G05B 19/4187; G05B 19/41875; G05B 2219/32017; G05B 2219/32239; G05B 19/41865; Y02P 90/02
See application file for complete search history.

(56) References Cited

U.S. PATENT DOCUMENTS

| | | | | |
|---|---|---|---|---|
| 5,801,945 A | * | 9/1998 | Comer | G05B 19/41865 700/99 |
| 6,122,566 A | * | 9/2000 | Nguyen | H01L 21/67276 700/218 |
| 7,072,731 B1 | * | 7/2006 | Barto | G05B 19/41865 700/102 |

(Continued)

FOREIGN PATENT DOCUMENTS

| | | |
|---|---|---|
| JP | 2003162304 A | 6/2003 |
| JP | 6369170 B2 | 12/2013 |
| KR | 10-1866857 B1 | 6/2018 |

OTHER PUBLICATIONS

International Search Report and Written Opinion dated Oct. 8, 2021 for PCT Application No. PCT/US2021/038756.

*Primary Examiner* — Mohammed Shamsuzzaman
(74) *Attorney, Agent, or Firm* — Lowenstein Sandler LLP

(57) ABSTRACT

A method includes generating a queue of a plurality of operations in a sequence recipe, the plurality of operations being associated with substrate processing. The method further includes sorting the plurality of operations in the queue based on a plurality of completion times corresponding to the plurality of operations. The method further includes, for each operation of the plurality of operations in the queue, obtaining a next operation in the queue and setting a virtual time axis to time leap to a corresponding completion time of the next operation until each operation of the plurality of operations in the queue are completed to generate a schedule for the sequence recipe.

15 Claims, 6 Drawing Sheets

(56) References Cited

U.S. PATENT DOCUMENTS

| | | | |
|---|---|---|---|
| 8,509,937 B2* | 8/2013 | Takuma | H01L 21/67745 |
| | | | 700/285 |
| 8,527,080 B2 | 9/2013 | Assaf et al. | |
| 10,162,341 B2* | 12/2018 | Norman | G06F 9/505 |
| 10,359,769 B2 | 7/2019 | Emani | |
| 10,510,566 B2* | 12/2019 | Lin | H01L 21/67207 |
| 10,698,392 B2 | 6/2020 | Emani | |
| 2002/0173868 A1* | 11/2002 | Mukuta | G05B 19/41865 |
| | | | 700/121 |
| 2004/0243266 A1* | 12/2004 | Mata | G05B 19/41865 |
| | | | 700/99 |
| 2007/0004052 A1 | 1/2007 | Wada et al. | |
| 2008/0051929 A1* | 2/2008 | Hongkham | H01L 21/67276 |
| | | | 700/214 |
| 2008/0081540 A1* | 4/2008 | Sato | H01L 21/67219 |
| | | | 451/178 |
| 2011/0079177 A1* | 4/2011 | Asai | G05B 23/0278 |
| | | | 702/81 |
| 2011/0172800 A1 | 7/2011 | Koizumi et al. | |
| 2013/0178971 A1* | 7/2013 | Hashimoto | G05B 19/02 |
| | | | 700/121 |
| 2016/0052655 A1* | 2/2016 | Nguyen | C23C 16/52 |
| | | | 141/11 |
| 2016/0077015 A1* | 3/2016 | Holmes | G01N 33/50 |
| | | | 506/9 |
| 2016/0128203 A1* | 5/2016 | Lim | G05B 19/41875 |
| | | | 29/593 |
| 2019/0369913 A1* | 12/2019 | Hahn | G06F 3/0619 |
| 2020/0013654 A1 | 1/2020 | Matsuhashi et al. | |
| 2021/0366749 A1 | 11/2021 | Rhee | |

* cited by examiner

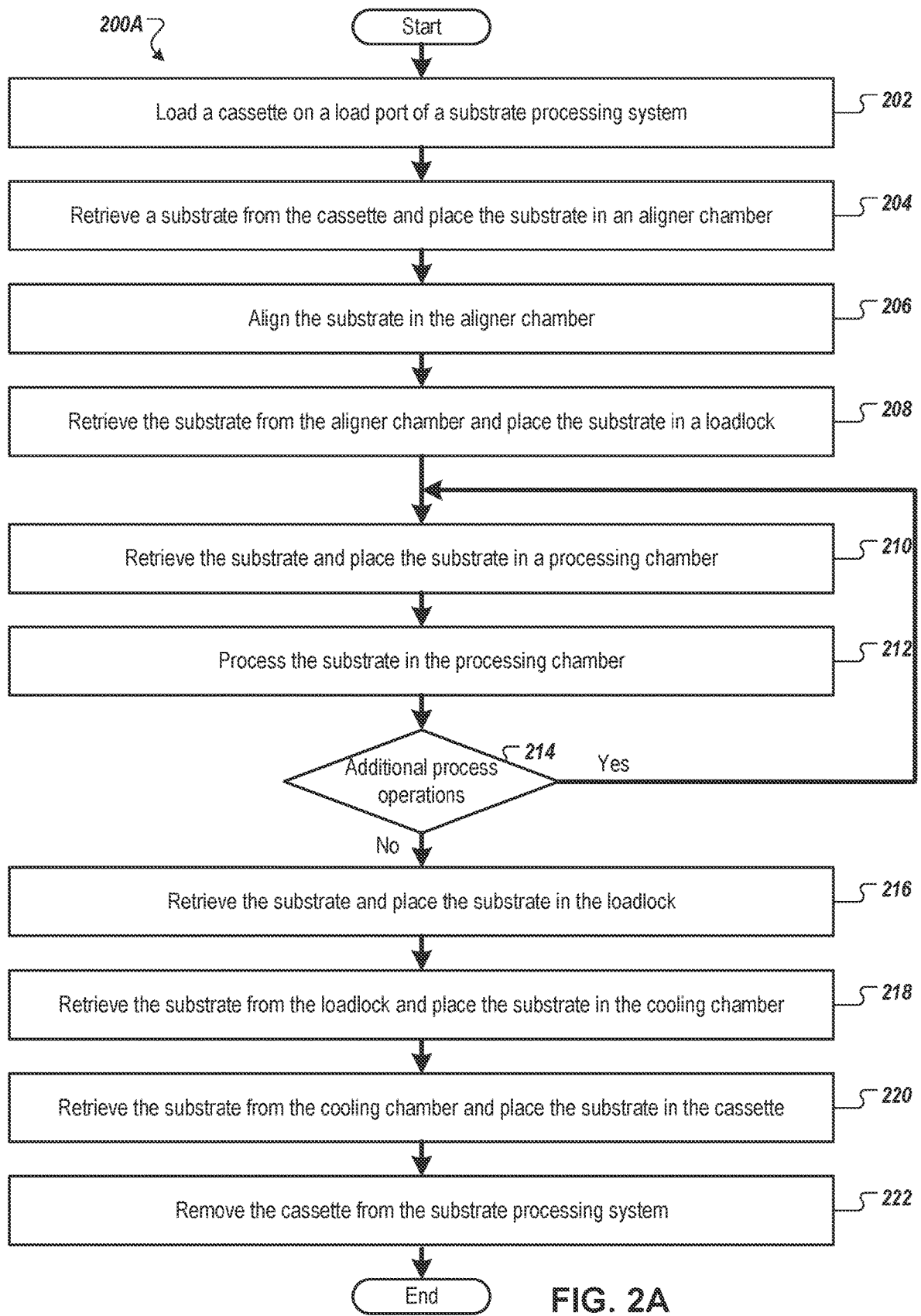

SEQUENCER TIME LEAPING EXECUTION

RELATED APPLICATION

This application is a continuation of U.S. patent application Ser. No. 16/911,244, filed Jun. 24, 2020, the entire contents of which are incorporated by reference herein.

TECHNICAL FIELD

The present disclosure relates to time leaping in manufacturing systems, such as substrate processing systems, and in particular to sequencer time leaping in a manufacturing system.

BACKGROUND

Products are produced by performing one or more manufacturing processes using manufacturing equipment. For example, substrate processing equipment is used to process substrates by transporting substrates to processing chambers and performing processes on the substrates in the processing chambers.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes receiving a plurality of operations in a sequence recipe. The plurality of operations are associated with processing a plurality of substrates in a substrate processing system. The method further includes identifying a plurality of completion times corresponding to the plurality of operations. Each completion time of the plurality of completion times corresponds to completion of a respective operation of the plurality of operations. The method further includes simulating the plurality of operations by setting a virtual time axis to each of the plurality of completion times to generate a schedule for the sequence recipe. The method further includes causing, based on the schedule, the plurality of substrates to be processed or performance of a corrective action.

In another aspect of the disclosure, a non-transitory machine-readable storage medium storing instructions which, when executed cause a processing device to receive a plurality of operations in a sequence recipe. The plurality of operations are associated with processing a plurality of substrates in a substrate processing system. The processing device is further to identify a plurality of completion times corresponding to the plurality of operations. Each completion time of the plurality of completion times corresponds to completion of a respective operation of the plurality of operations. The processing device is further to simulate the plurality of operations by setting a virtual time axis to each of the plurality of completion times to generate a schedule for the sequence recipe. The processing device is further to cause, based on the schedule, the plurality of substrates to be processed or performance of a corrective action.

In another aspect of the disclosure, a system includes memory and a processing device coupled to the memory. The processing device is to receive a plurality of operations in a sequence recipe. The plurality of operations are associated with processing a plurality of substrates in a substrate processing system. The processing device is further to identify a plurality of completion times corresponding to the plurality of operations. Each completion time of the plurality of completion times corresponds to completion of a respective operation of the plurality of operations. The processing device is further to simulate the plurality of operations by setting a virtual time axis to each of the plurality of completion times to generate a schedule for the sequence recipe. The processing device is further to cause, based on the schedule, the plurality of substrates to be processed or performance of a corrective action.

BRIEF DESCRIPTION OF THE DRAWINGS

The present disclosure is illustrated by way of example, and not by way of limitation in the figures of the accompanying drawings.

FIGS. 2A-B are flow diagrams of methods associated with time leaping, according to certain embodiments.

DETAILED DESCRIPTION

Figure 1A:
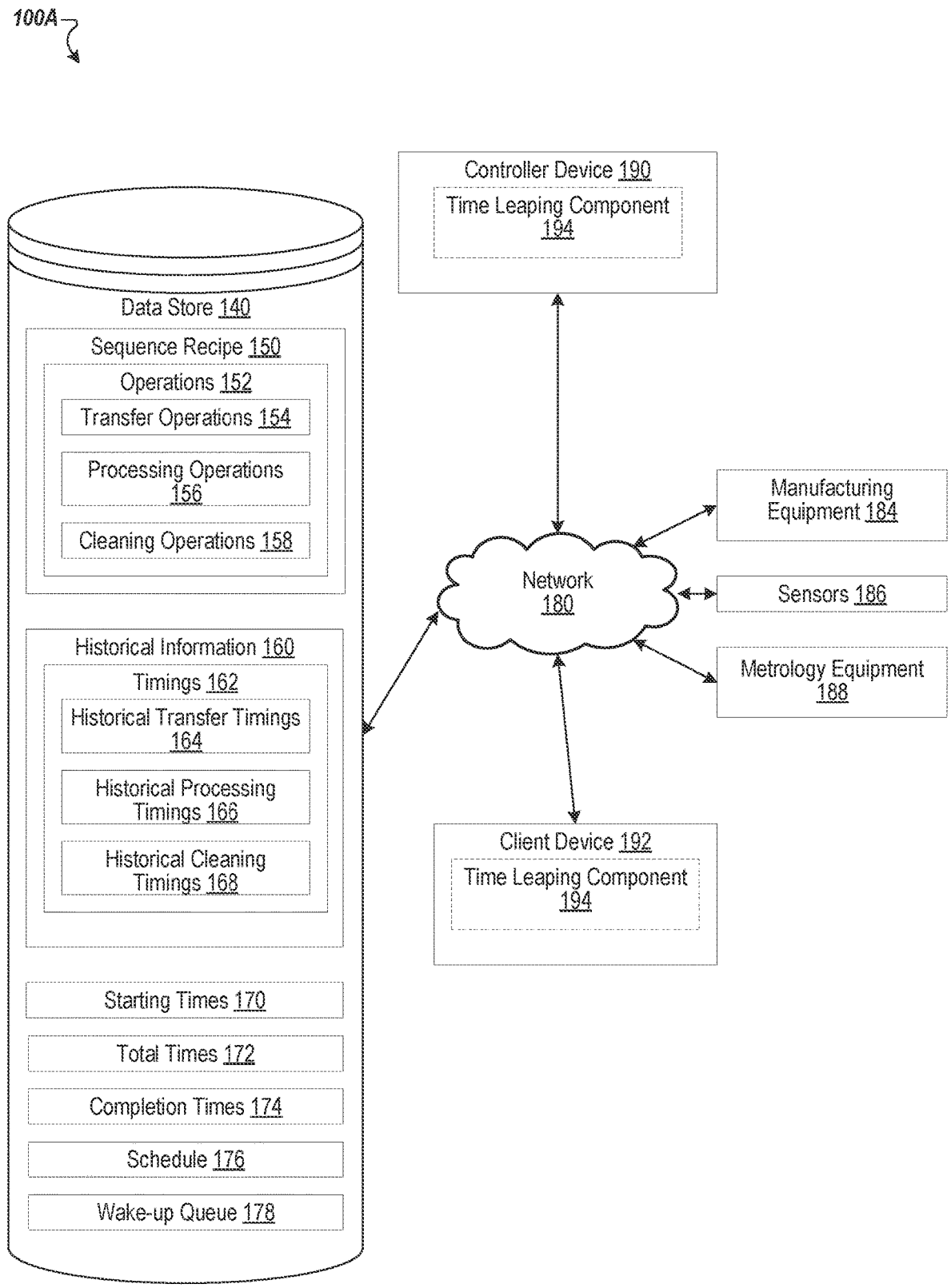
FIG. 1A is a block diagram illustrating an exemplary system architecture, according to certain embodiments.

Described herein are technologies directed to scheduler time leaping execution.

Products are produced by performing one or more manufacturing processes using manufacturing equipment. For example, substrate processing equipment is used to process substrates (e.g., wafers, semiconductors, displays, etc.). A substrate processing system processes substrates based on a sequence recipe that includes different operations such as transfer operations (e.g., robots transporting substrates to different locations), processing operations (e.g., processing substrates in processing chambers), cleaning operations (e.g., cleaning the processing chamber after a processing operation), and/or the like. For example, in semiconductor processing, multi-layer features are fabricated on substrates using specific processing recipes having multiple processing operations. The substrate processing system (e.g., cluster tool) includes multiple processing chambers to perform a process sequence (e.g., sequence of device fabrication operations or process recipe operations completed in processing chambers of the cluster tool) of a recipe without removing the substrates from the processing environment (e.g., of the substrate processing system). A substrate processing system has a limited amount of robots to perform the transfer operations and a limited amount of processing chambers to perform the processing operations. For a substrate to move on to the next operation, the substrate is to complete the preceding operation, the corresponding type of processing chamber is to be available, and a corresponding robot is to be available.

In conventional systems, the substrate transfer operations and processing operations are controlled based on the current state of the system. Given the different possible routings of substrates to different possible processing chambers via different possible robots, in conventional systems, wafers are routed in many different random orders with inconsistent timings. The randomness of routings and different timings causes deadlocks of equipment in the substrate processing system, random delays, decreased throughput, different substrates being delayed for different amount of times in processing chambers causing non-uniformity among substrates, and/or the like.

In some conventional systems, a test batch of substrates are processed based on the recipe in the substrate processing system to attempt to identify deadlocks, delays, and/or the like. Performing the operations of the recipe on a test batch of substrates is time consuming, uses an increased amount of resources (e.g., substrates, substrate processing material, energy, etc.), and causes damage (e.g., wear and tear) to the substrate processing system.

In some conventional systems, a real-time simulation of processing of substrates are performed in a computer system. The real-time simulation takes as the actual processing of substrates. For example, if processing of an amount of substrates takes ten hours, the real-time simulation also takes ten hours. Performing the real-time simulation of processing of substrates is time consuming and uses an increased amount of resources (e.g., energy, processor overhead, etc.).

Given the amount of time and resources used by conventional systems (e.g., processing a test batch of substrates, the real-time simulation of processing of substrates), a subset of the different possible random orders are tested. The testing of these test cases can take weeks to accomplish. Even if some random orders (e.g., test cases) are tested and do not cause a deadlock, a different random order (e.g., an untested test case) could happen in actual use which would cause a deadlock, damage, delays, decreased throughput, non-uniformity among substrates, and/or the like.

The devices, systems, and methods disclosed herein provide scheduler time leaping execution. A processing device receives the operations of a sequence recipe. The operations include transfer operation, processing operations, and cleaning operations associated with processing substrates in a substrate processing system.

The processing device identifies completion times of the operations of the sequence recipe. For example, the processing device identifies completion times of each of the transfer operations (e.g., robot has dropped off a substrate and is ready to pick-up the next substrate), processing operations (e.g., processing chamber has finished processing a substrate and the substrate is ready to be removed from the processing chamber), and cleaning operations (e.g., processing chamber has finished being cleaned and is ready to receive the next substrate).

The processing device simulates the operations by setting a virtual time axis to each of the completion times to generate a schedule (e.g., timetable). The processing device simulates the operations by setting the virtual time axis to time leap to each completion time. In some embodiments, by using the virtual time axis, each operation takes one cycle of the central processing unit (CPU) of the processing device instead of the actual real-time.

Time leaping refers to skipping from a first point in time to a second point in time (e.g., skipping intermediate points in time). Using a real time axis refers to every amount of time in an actual scenario taking the same amount of time in a simulation. For example, for a 1 minute transfer operation and a 30 minutes processing operation of an actual substrate would take 31 minutes to simulate using a real time axis. Using a virtual time axis refers to time leaping to points in time of the real scenario (e.g., while skipping intermediate points in time). For example, a transfer operation ending at 1 minute and a processing operation ending at 31 minutes would take 2 cycles of a central processing unit (CPU) (e.g., about 1 nanosecond) simulate using a virtual time axis (e.g., by time leaping to the end of the transfer operation in one cycle of the CPU and then time leaping to the end of the processing operation in another cycle of the CPU).

By simulating the operations using the virtual time axis, the processing device generates a schedule of the sequence recipe. The schedule includes information regarding which operations are to be performed by a corresponding component (e.g., robot, processing chamber, etc.) and when each component is to end an operation (e.g., is ready for a new operation).

The processing device uses the schedule to perform a corrective action or to cause the substrates to be processed. In some examples, if the schedule indicates a deadlock, a corrective action of updating the schedule is performed. Given the quickness of the simulation using the virtual time axis, different updates can be made to the sequence recipe and tested. Different random orders of the operations in the sequence recipe can be tested. Once the schedule is ready (e.g., does not have any more deadlocks), the schedule is used to process substrates in the substrate processing system.

Aspects of the present disclosure result in technological advantages. By setting a virtual time axis to completion times of operations to simulate the operations, less time, less energy, less processor overhead, less substrates, and less materials used to process substrates are used compared to conventional systems. By setting a virtual time axis to completion times of operations to simulate the operations, less damage occurs to substrate processing equipment compared to conventional systems. By setting a virtual time axis to completion times of operations to simulate the operations, more orders of operations and updates to sequence recipes are able to be tested compared to conventional systems. This allows for less deadlocks, less damage, less delays, increased throughput, and less non-uniformity among substrates compared to conventional systems.

Although some embodiments of the present disclosure describe transporting and processing substrates in a substrate processing system, the present disclosure, in some embodiments, is applied to other systems, such as manufacturing systems, etc. that perform operations over time.

FIG. 1A is a block diagram illustrating a system 100A (e.g., an exemplary system architecture, computing environment), according to certain embodiments. The system 100A includes a client device 192, manufacturing equipment 184 (e.g., cluster tool, substrate processing equipment), sensors 186, metrology equipment 188, a controller device 190 (e.g., controller, server), and a data store 140.

The client device 192, manufacturing equipment 184, sensors 186, metrology equipment 188, controller device 190, and are coupled to each other via a network 180 for simulating operations using a virtual time axis to generate a schedule 176. In some embodiments, network 180 is a public network that provides client device 192 with access to the controller device 190, data store 140, and other publicly available computing devices. In some embodiments, network 180 is a private network that provides client device 192 access to manufacturing equipment 184, sensors 186, metrology equipment 188, data store 140, and other privately available computing devices. Network 180 include one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The controller device 190 (e.g., controller, server) includes one or more computing devices such as a rack-mount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc. In some embodiments, the controller device 190 includes a time leaping component 194 for simulating operations using a virtual time axis to generate a schedule 176. In some embodiments, the time leaping component 194 is used to perform one or more operations of methods 200A-B of FIGS. 2A-B. In some embodiments, controller device 190 is a controller of a semiconductor processing system and is used to control the manufacturing equipment 184.

The client device 192 includes a computing device such as Personal Computers (PCs), laptops, mobile phones, smart phones, tablet computers, netbook computers, network connected televisions ("smart TV"), network-connected media players (e.g., Blu-ray player), a set-top-box, Over-the-Top (OTT) streaming devices, operator boxes, etc. In some embodiments, the client device 192 displays a Graphical User Interface (GUI) to receive input and to display output. In some embodiments, the client device 192 includes a time leaping component 194 for simulating operations using a virtual time axis to generate a schedule 176. In some embodiments, the time leaping component 194 is used to perform one or more operations of methods 200A-B of FIGS. 2A-B.

In some embodiments, a sequence recipe 150 is provided to the client device 192 (e.g., via user input). The sequence recipe 150 describes what possible processing chambers a substrate will visit at different stages and the process to be run in each chamber. The client device 192 then generates a schedule 176 (e.g., by simulating the operations 152 of the sequence recipe 150 using a virtual time axis to time leap to the different completion times 174) and provides the schedule 176 to the controller device 190 to cause the substrates to be processed by manufacturing equipment 184 (e.g., in a cluster tool) without deadlocks and with improved throughput.

In some embodiments, the manufacturing equipment 184 (e.g., cluster tool) is part of a substrate processing system (e.g., integrated processing system). The manufacturing equipment 184 includes one or more of an enclosure system (e.g., substrate carrier, front opening unified pod (FOUP), auto teach FOUP, process kit enclosure system, substrate enclosure system, cassette, etc.), a side storage pod (SSP), an aligner device (e.g., aligner chamber), a factory interface (e.g., equipment front end module (EFEM)), a load lock, a transfer chamber, one or more processing chambers, a robot arm (e.g., disposed in the transfer chamber, disposed in the front interface, etc.), and/or the like. The enclosure system, SSP, and load lock mount to the factory interface and a robot arm disposed in the factory interface is to transfer content (e.g., substrates, process kit rings, carriers, validation wafer, etc.) between the enclosure system, SSP, load lock, and factory interface. The aligner device is disposed in the factory interface to align the content. The load lock and the processing chambers mount to the transfer chamber and a robot arm disposed in the transfer chamber is to transfer content (e.g., substrates, process kit rings, carriers, validation wafer, etc.) between the load lock, the processing chambers, and the transfer chamber.

The manufacturing equipment 184 includes one or more processing chambers to produce substrates based on a schedule 176 generated based on a sequence recipe 150. The sequence recipe 150 includes a set of operations 152 to produce features (e.g., deposit layers, fabricate multi-layer features) on a substrate.

The sensors 186 provide sensor data (e.g., sensor values, trace data) associated with manufacturing equipment 184 (e.g., associated with producing, by manufacturing equipment 184, substrates). In some embodiments, the sensor data is used to determine manufacturing parameters of the manufacturing equipment 184. In some embodiments, the sensor data is used for equipment health and/or product health (e.g., substrate quality). The manufacturing equipment 184 produces substrates based on schedule 176 over a period of time. Sensor data (e.g., trace data) is received from different sensors 186 over a period of time (e.g., corresponding to at least part of a sequence recipe 150 or run).

The metrology equipment 188 is used to determine metrology data corresponding to products of the manufacturing equipment 184. In some embodiments, after the manufacturing equipment 184 deposits one or more layers on a substrate, the metrology equipment 188 is used to determine one or more of thicknesses of the layers, uniformity of the layers, interlayer spacing of the layer, or the like. In some embodiments, the metrology equipment 188 includes an imaging device.

Data store 140 is a memory (e.g., random access memory), a drive (e.g., a hard drive, a flash drive), a database system, or another type of component or device capable of storing data. Data store 140 includes multiple storage components (e.g., multiple drives or multiple databases) that span multiple computing devices (e.g., multiple server computers). The data store 140 stores sequence recipe 150, historical information 160, starting times 170, total times 172, completion times 174, schedule 176 (e.g., schedule in a file), and wake-up queue 178.

Sequence recipe 150 includes operations 152. Operations 152 include transfer operations 154 (e.g., robot operation), processing operations 156 (e.g., chamber operation), and cleaning operations 158.

Historical information 160 includes timings 162. Timings 162 include historical transfer timings 164, historical processing timings 166, and historical cleaning timings 168. In some embodiments, the timings 162 are averages of historical timings.

Starting times 170 are times for each of the operations 152 to start. In some embodiments, the starting times 170 are specified by the sequence recipe 150. In some embodiments, the starting times 170 are determined based on completion times 174 of components (e.g., robot, processing chamber) that are to be used by the operations 152 associated with the starting times.

Total times 172 are the total times for completion of operations 152. In some embodiments, the total times 172 are based on historical information 160 (e.g., a processing operation historically takes an average amount of time). In some embodiments, total times 172 are based on the sequence recipe 150 (e.g., a processing operation 156 is to take a predetermined amount of time)

Completion times 174 are the points in time when an operation 152 is completed and/or the component performing the operation 152 is ready for the next operation.

Schedule 176 (e.g., timetable) includes information regarding which operations 152 are to be performed by a corresponding component (e.g., robot, processing chamber, etc.) and when each component is to end an operation 152 (e.g., is ready for a new operation). The schedule 176 is used by controller device 190 to control the manufacturing equipment 184 to transfer and process the substrates. The schedule 176 is used to determine whether a corrective action is to be performed (e.g., the schedule 176 indicates a deadlock of a component being directed to do two different operations at the same time). In some embodiments, the schedule 176 is a timetable that includes timestamps (e.g., virtual timestamps, future timestamps) of when operations are to begin and/or end.

Wake-up queue 178 is based on the starting times 170 and total times 172 of each of the operations 152. The operations 152 in the wake-up queue 178 are sorted based on the completion times 174. During simulation of the operations using the virtual time axis, for each operation 152, the next operation in the wake-up queue 178 is obtained and the virtual time axis is set to time leap to a completion time 174 of that next operation until each operation 152 in the wake-up queue is completed.

In some embodiments, data store 140 stores sensor data (e.g., as historical information 160) from sensors 186. Sensor data include values of one or more of temperature (e.g., heater temperature), spacing (SP), pressure, High Frequency Radio Frequency (HFRF), Low Frequency Radio Frequency (LFRF), Radio Frequency (RF) power, voltage of Electrostatic Chuck (ESC), electrical current, flow, power, voltage, etc. In some embodiments, sensor data is associated with or indicative of manufacturing parameters such as hardware parameters (e.g., settings or components (e.g., size, type, etc.) of the manufacturing equipment 184) or process parameters of the manufacturing equipment. The sensor data is provided while the manufacturing equipment 184 is performing manufacturing processes (e.g., equipment readings when processing products). In some embodiments, the sensor data is different for each substrate and/or layer.

In some embodiments, data store 140 stores metrology data (e.g., as historical information 160) from metrology equipment 188. Metrology data includes image data, thickness values, interlayer spacing values, uniformity values, performance data, whether layers of a substrate meet threshold values, an indication of variance in the layers of the substrate, property data of substrates, yield, substrate spatial film properties, dimensions (e.g., thickness, height, etc.), dielectric constant, dopant concentration, density, defects (e.g., whether a substrate and/or layer meets a threshold property, why the substrate and/or layer does not meet a threshold property), and/or the like. In some embodiments, the metrology data is for finished or semi-finished substrates. In some embodiments, the metrology data is different for each substrate and/or layer.

In some embodiments, the sensor data and/or metrology data is used to determine whether the sequence recipe 150, completion times 174, and/or schedule 176 are to be updated (e.g., to improve quality of substrates, health of the manufacturing equipment 184, energy usage, etc.).

For purpose of illustration, rather than limitation, aspects of the disclosure describe simulating operations using a virtual time axis to generate a schedule 176. In some implementations, a heuristic model or rule-based model is used to simulate operations using a virtual time axis to generate a schedule 176. Time leaping component 194 monitors historical information 160 to simulate operations using a virtual time axis to generate a schedule 176. In some embodiments, a trained machine learning model is used to determine completion times 174 and/or schedule 176. Historic sequence recipes and historical information are used as data input and historic completion times 174 and/or historic schedule 176 are used as target output to train a machine learning model. Sequence recipe 150 and historical information 160 are used as input into the trained machine learning model and completion times 174 and/or schedule 176 are determined from the output of the trained machine learning model.

In some embodiments, the functions of client device 192 and controller device 190 are provided by a fewer number of machines. In some embodiments, client device 192 and controller device 190 are integrated into a single machine.

In some embodiments, one or more functions described as being performed by client device 192 can also be performed on controller device 190, if appropriate. In some embodiments, one or more functions described as being performed by controller device 190 can also be performed on client device 192, if appropriate. In addition, the functionality attributed to a particular component can be performed by different or multiple components operating together. For example, in some embodiments, the controller device 190 simulates operations using a virtual time axis to generate a schedule 176 and in some embodiments, the client device 192 simulates operations using a virtual time axis to generate a schedule 176.

In addition, the functions of a particular component can be performed by different or multiple components operating together. In some embodiments, the controller device 190 is accessed as a service provided to other systems or devices through appropriate application programming interfaces (API).

In embodiments, a "user" is represented as a single individual. However, other embodiments of the disclosure encompass a "user" being an entity controlled by a plurality of users and/or an automated source. For example, a set of individual users federated as a group of administrators is considered a "user."

Although portions of the present disclosure refer to simulating operations using a virtual time axis to generate a schedule 176 for transferring and processing substrates in a substrate processing system, in some embodiments, the present disclosure is generally applied simulating other processes using a virtual time axis (e.g., for performing other processes via a manufacturing system).

Figure 1B:
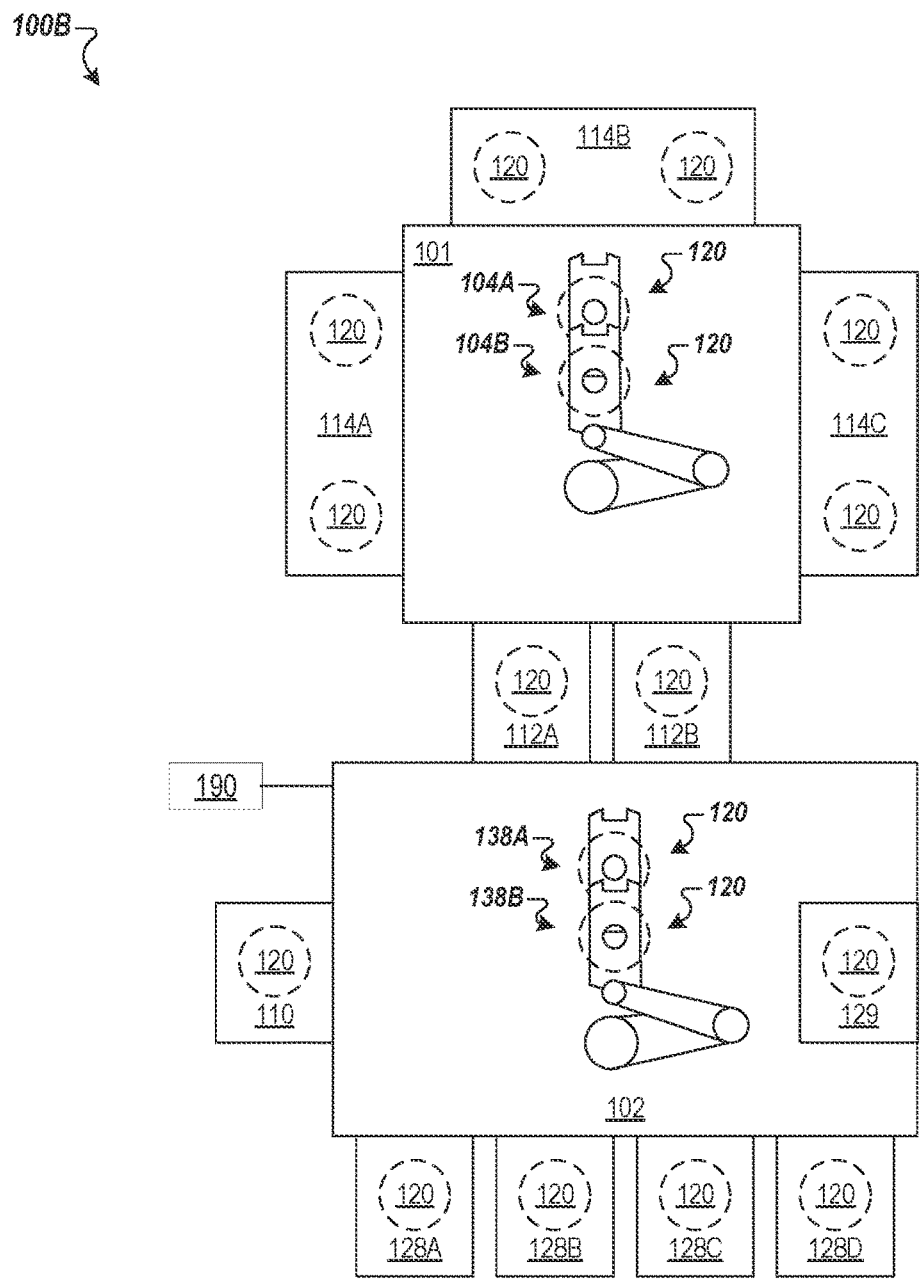
FIG. 1B is a processing system, according to certain embodiments.

FIG. 1B is a processing system 100B (e.g., manufacturing equipment 184, cluster tool for substrate processing), according to certain embodiments. The processing system 100B is configured to perform a sequence recipe 150 (e.g., process sequence).

The processing system 100B includes a transfer chamber 101 and a factory interface 102 (e.g., equipment front end module (EFEM)). One or more front opening unified pods (FOUPs) 128A-D (e.g., cassette, enclosure system, substrate carrier, etc.), cooling chamber 110 (e.g., sides storage pod (SSP)), and one or more loadlocks 112 mount to the factory interface 102. One or more robots 138A-B are disposed in the factory interface 102 to transfer content 120 (e.g., substrates, wafers, semiconductors, displays, process kit rings, carriers, validation wafer, etc.) between the FOUPs 128, cooling chamber 110, loadlocks 112, and factory interface 102. An aligner device 129 is disposed in the factory interface to align the content 120. One or more loadlocks 112 and one or more processing chambers 114 are mounted to the transfer chamber 101. One or more robots 104A-B are located in the transfer chamber 101 to transfer content 120 between the loadlocks 112, processing chambers 114, and the transfer chamber 101. A local center finding (LCF) device (not shown) is located in the transfer chamber 101 to align the content 120.

Operations of a sequence recipe including transfer operations of the robots 138A-B and 104A-B, processing operations of the processing chambers 114, and cleaning operations of the processing chambers 114 are simulated by setting a virtual time axis to completion times of the operations to generate a schedule 176. The schedule 176 is used to cause the components of processing system 100B to perform the operations of the sequence recipe.

Processing system 100B is in communication with a controller device 190. The controller device 190 is a controller that controls the components (e.g., robots, processing chambers, etc.) in processing system 100B. In some embodiments, the controller device 190 provides the sequence recipe 150 to the client device 192 and the client device provides the schedule 176 (e.g., generated based on simulation of the operations of the sequence recipe 150 by setting a virtual time axis to the completion times) to the controller device 190. The controller device 190 causes the substrates to be transferred and processed based schedule 176.

Figure 2B:
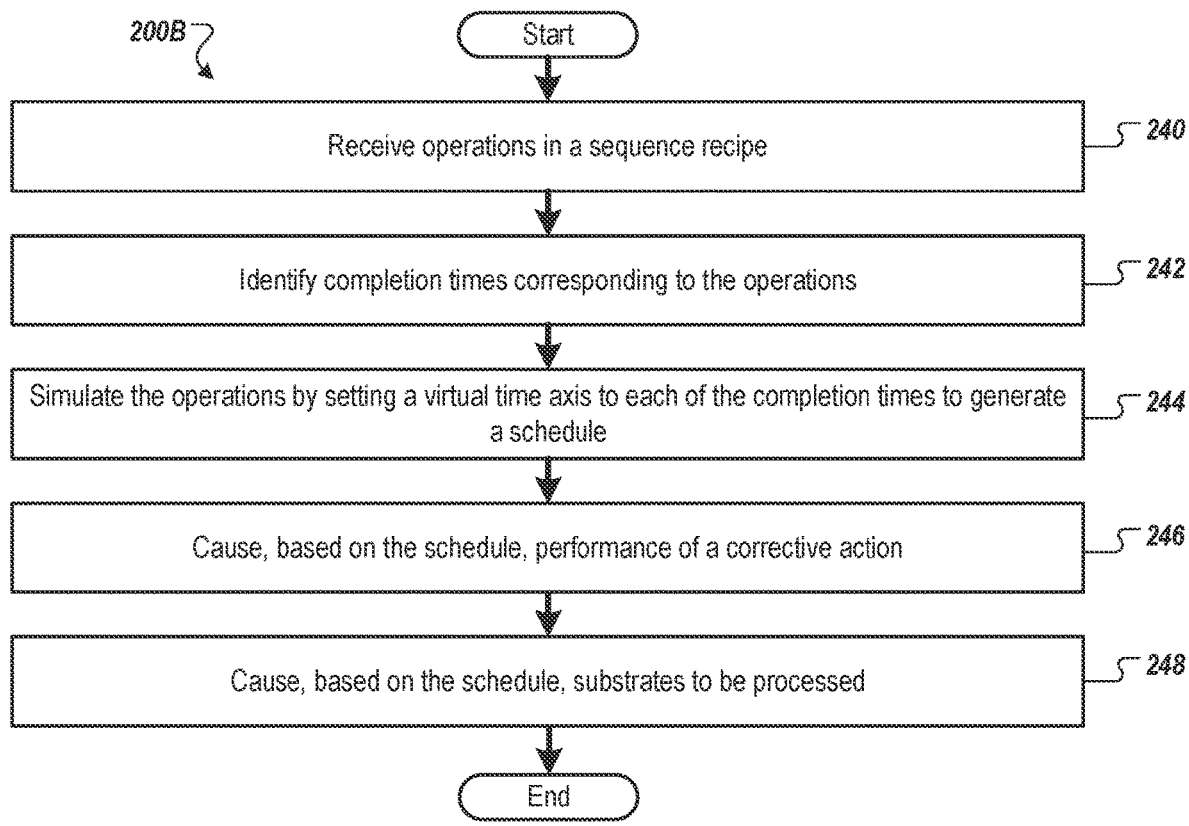

FIGS. 2A-B are flow diagrams of methods 200A-B associated with time leaping, according to certain embodiments. Methods 200A-B are performed by processing logic that include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, methods 200A-B are performed, in part, by controller device 190 (e.g., time leaping component 194). In some embodiments, methods 200A-B are performed, in part, by client device 192 (e.g., time leaping component 194). In some embodiments, a non-transitory storage medium stores instructions that when executed by a processing device (e.g., of controller device 190, client device 192, etc.) cause the processing device to perform one or more of methods 200A-B.

For simplicity of explanation, methods 200A-B are depicted and described as a series of operations. However, operations in accordance with this disclosure can occur in various orders and/or concurrently and with other operations not presented and described herein. Furthermore, in some embodiments, not all illustrated operations are be performed to implement methods 200A-B in accordance with the disclosed subject matter. In addition, those skilled in the art will understand and appreciate that methods 200A-B could alternatively be represented as a series of interrelated states via a state diagram or events.

FIG. 2A is a flow diagram of a method 200A (e.g., process sequence for processing a substrate) for substrate processing equipment (e.g., an integrated cluster tool, manufacturing equipment 124 of FIG. 1A, processing system 100B of FIG. 1B), according to certain embodiments.

At block 202 of method 200A, processing logic loads a cassette (e.g., FOUP 128 of FIG. 1B) on a load port of a substrate processing system (e.g., manufacturing equipment 184 of FIG. 1A, processing system 100B of FIG. 1B, etc.). In some embodiments, a carrier robot loads the cassette on a load port mounted to the factory interface of the substrate processing system.

At block 204, processing logic retrieves (e.g., via a robot disposed in the factory interface) a substrate from the cassette and places the substrate in an aligner device (e.g., aligner device 129 of FIG. 1B, aligner chamber, etc.).

At block 206, processing logic aligns the substrate in the aligner device.

At block 208, processing logic retrieves (e.g., via a robot disposed in the factory interface) the substrate from the aligner chamber and places the substrate in a loadlock (e.g., loadlock 112 of FIG. 1B).

At block 210, processing logic retrieves (e.g., via a robot disposed in the transfer chamber) the substrate and places the substrate in a processing chamber (e.g., processing chamber 114 of FIG. 1B).

At block 212, processing logic processes the substrate in the processing chamber. In some embodiments, the processing chamber performs a plating (e.g., with copper, nickel (Ni), tin-silver alloy (SnAG)) process, a spinning ring maintenance process, a vacuum pre-wet process, addition or removal of a protective assembly (e.g., protective covering, safeseal) process, spinning and/or drying process, heating process, etching process, and/or the like.

At block 214, processing logic determines whether additional process operations are to be performed on the substrate. Responsive to determining that additional process operations are to be performed, the flow continues to block 210 to perform further processing on the substrate. Responsive to determining that additional process operations are not to be performed, the flow continues to block 216.

At block 216, processing logic retrieves (e.g., via a robot disposed in the transfer chamber) the substrate and places the substrate in the loadlock.

At block 218, processing logic retrieves (e.g., via a robot disposed in the factory interface) the substrate from the loadlock and places the substrate in a cooling chamber (e.g., cooling chamber 110 of FIG. 1B).

At block 220, processing logic retrieves (e.g., via a robot disposed in the factory interface) the substrate from the cooling chamber and places the substrate in a cassette (e.g., FOUP 128 of FIG. 1B).

At block 222, processing logic removes the cassette from the substrate processing system. In some embodiments, a carrier robot removes the cassette from the load port once the substrates in the cassette have been processed (e.g., and the cassette has been sealed).

After removing the cassette of processed substrates from the load port, method 200A is repeated with a cassette of unprocessed substrates (e.g., a carrier robot places a cassette of unprocessed substrates on the load port).

In some embodiments, one or more operations of method 200A are operations of a sequence recipe. In some embodiments, one or more operations of method 200A are simulated by setting a virtual time axis to each of the completion times (e.g., time leaping to each completion time) to generate a schedule that is used to detect deadlocks, preposition robots, prepare processing chambers, provide an improved throughput, and provide improved substrate-to-substrate consistency. In some examples, the robots used to perform blocks 202, 204, 208, 210, 216, 218, 220, and 222 are to be prepositioned (e.g., prior to the completion of the previous operation) to perform the operation. This provides improved throughput compared to conventional systems that start to move the robots after the previous operation has completed. In some examples, one or more of the aligner device used in block 206, the loadlocks used in blocks 208, 216, and 218, the processing chambers used in block 212, and/or the cooling chamber used in blocks 218-220 are prepared (e.g., prior to the completion of the previous operation) to perform the operation. This provides improved throughput compared to conventional systems that start to prepare components after the previous operation has completed.

In some embodiments, one or more operations of method 200A are in a schedule and performance of a corrective action or processing of substrates are performed based on the schedule.

Referring to FIG. 2B, method 200B is associated with simulating operations (e.g., method 200A) to generate a schedule for processing substrates in a substrate processing system (e.g., cluster tool, manufacturing equipment 184 of FIG. 1A, processing system 100B of FIG. 1B, etc.).

At block 240 of method 200B, processing logic receives operations in a sequence recipe. The operations are associated with processing substrates in a substrate processing system. The operations include substrate transfer operations (e.g., via a robot), one or more substrate processing operations (e.g., via a processing chamber), and one or more cleaning operations (e.g., of the processing chamber).

At block 242, processing logic identifies completion times corresponding to the operations. In some embodiments, block 242 includes determining, based on the sequence recipe and historical timings, a corresponding starting time and a corresponding total time of each of the operations. A corresponding sum of the corresponding starting time and the corresponding total time of each of the operations to generate the completion times.

At block 244, processing logic simulates the operations by setting a virtual time axis to each of the completion times to generate a schedule.

In some embodiments, block 244 includes generating a wake-up queue based on a corresponding starting time and a corresponding total time of each of the operations. The operations in the wake-up queue are sorted based on the plurality of completion times. For each of the operations in the wake-up queue, the processing logic obtains a next operation in the wake-up queue and sets the virtual time axis to time leap to a corresponding completion time of the next operation until each of the operations in the wake-up queue are completed.

In some embodiments, at block 240, a sequencer code (e.g., including heuristic logics, sequence recipe of operations) is received and at block 244, the processing logic runs the sequencer code to generate output and stores the output in a format of the schedule for the sequence recipe. In some embodiments, the heuristic logic is a rule-based logic. In some examples, the rule-based logic indicates that a substrate is to be transferred after meeting the following conditions: 1) the substrate has finished an operation at a current location (e.g., a current processing operation in a current processing chamber); 2) the next location of the next operation is available (e.g., the next processing chamber of the next processing operation is available); and 3) a robot is available to transfer the substrate from the current location to the next location.

At block 246, processing logic causes, based on the schedule, performance of a corrective action. In some embodiments, at block 246, the processing logic predicts, based on the schedule, one or more deadlocks in the substrate processing system and causes the sequence recipe to be updated to prevent the one or more deadlocks.

At block 248, processing logic causes, based on the schedule, substrates to be processed.

In some embodiments, at block 248, the processing logic prepositions, based on the schedule, one or more robots within the substrate processing system for one or more corresponding transfer operations.

In some embodiments, at block 248, the processing logic prepares, based on the schedule, one or more processing chambers within the substrate processing system for one or more corresponding processing operations.

In some embodiments, at block 248, the processing logic predicts, based on the schedule, a completion time of a first cassette of substrates and prepositions, based on the completion time, one or more carrier robots to unload the first cassette of substrates from the substrate processing system and to load a second cassette of substrates to the substrate processing system.

In some embodiments, the processing logic implements a parallel thread with the same code (e.g., schedule) which is working under a time leaping mode (e.g., simulating the operations by setting a virtual time axis to the completion times of the operations) for robot optimization, processing chamber preparation, cassette completion time prediction, and/or the like. In some examples, the processing logic causes (e.g., by executing code via a first thread using a real time axis) substrates to be transferred and processed based on the schedule and causes (e.g., executing the same code via a second thread that is parallel to the first thread, where the second thread is running a virtual time axis) components to be prepositioned (e.g., robots, new cassette) and prepared (e.g., processing chambers) for the next operation based on the schedule.

In some embodiments, completion times, topology information, historical timing information, and/or sequence recipe changes over time. In some examples, one or more components are added to and/or removed from the substrate processing system which changes the topology information. In some embodiments, one or more transfer operations, processing operations, and/or cleaning operations become faster or slower over time which changes the completion times and/or historical timing information. In some embodiments, method 200B of FIG. 2B is repeated with updated completion times, updated topology information, updated historical timing information, and/or updated sequence recipe to generate an updated schedule for performing a corrective action and/or processing substrates in the substrate processing system.

Figure 3:
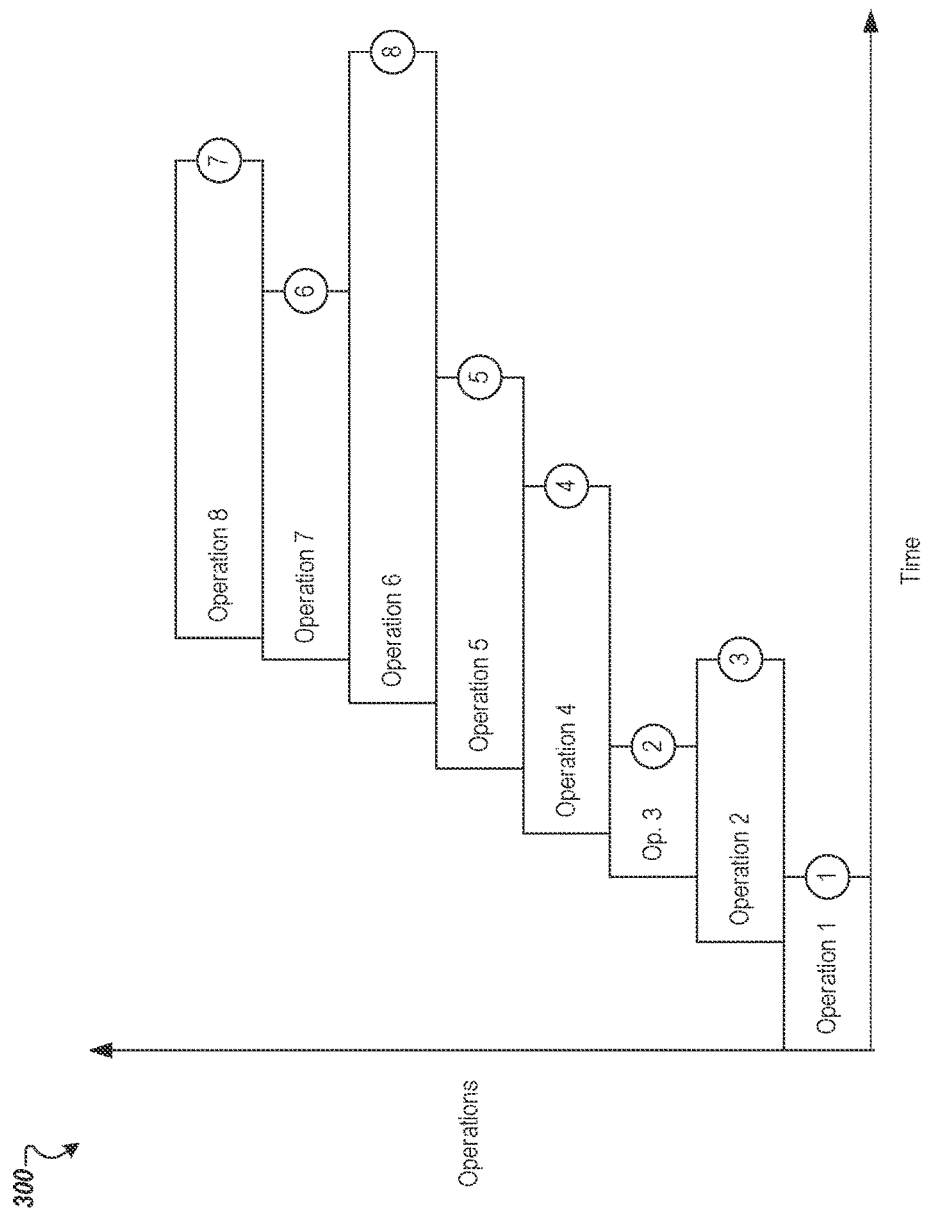
FIG. 3 illustrates a graph of time leaping, according to certain embodiments.

FIG. 3 illustrates a graph 300 of time leaping, according to certain embodiments. As shown in FIG. 3, in one example a sequence recipe includes 8 operations that each have a start time (e.g., starting a transfer operation, starting a processing operation, starting a cleaning operation), a total time (e.g., total time to complete the operation), and a completion time. Each of the operations has a different start time and completion time. Some of the operations have different total times. The completion times are shown as a number in a circle. Some of the operations have a completion time that occur before a preceding operation. Conventionally, to simulate operations 1-8, a real time axis is used causing the simulation time to take as long as the time to actually process the substrates based on operations 1-8 (e.g., several hours). To troubleshoot the operations, the operations are to be updated and re-simulated over and over, taking a very long time (e.g., weeks).

As disclosed herein, to simulate operations 1-8, a virtual time axis is used to time leap to the completion times 1-8 (e.g., instead of running through the real time of the transferring and processing of the substrates) which, in some examples, takes 8 cycles of a CPU. In some embodiments, a CPU goes through 2,000,000,000 cycles per second, then the 8 cycles of the CPU takes 4 nanoseconds. To troubleshoot the operations, the operations are updated and re-simulated over and over. Given the nanoseconds per simulation of the present disclosure verses hours per simulation of conventional solutions, the present disclosure time can be used to perform many more simulations with decreased time, energy, and processor overhead, resulting in an improved schedule with improved throughput and less deadlocks. In some embodiments, the same sequencer code of a sequence recipe that is entered into conventional real-time simulation systems is entered into the system disclosed herein (e.g., virtual time axis time leaping to completion times simulation) and the system disclosed herein is much faster and uses less energy and processor overhead than the conventional real-time simulation systems.

Calculation of one or more batches (e.g., cassettes, FOUPs) of substrates is also much quicker using the present disclosure (e.g., time leaping execution). Using the present disclosure, the computing time is T*N*M, where T is the sequencer average calculation time on each wake up (e.g., one cycle of a CPU), N is the number of substrates, and M is the number of sequence operations assigned to a substrate. The present disclosure provides a fast execution that is not related to the real time of the sequence recipe (e.g., real transfer time, real processing time, real cleaning time).

In some embodiments, the present disclosure (e.g., time leaping execution of simulating operations by using a virtual time axis to time leap to completion times) is applied to sequencer release testing, throughput validation, sequencer self-prediction, creation of a time-based schedule, and/or the like. Sequencer release testing using the time leaping execution takes a lot less time for testing compared with the current real-time testing that depends on the real recipe time and real transfer time. Throughput validation using time leaping execution provides a rapid answer to feasibility verification phase of product development. Sequencer self-prediction using time leaping execution allows a processing device (e.g., sequencer) to implement a parallel thread (e.g., with the same code) which is working under a time-leaping mode and the prediction result can be used for robot optimization (e.g., know what robots are to do next so that robots can be prepositioned to the location for the next operation) and cassette completion time prediction (e.g., cassette completion time is to be known to use the substrate processing system more efficiently). The schedule created using the time leaping execution is a time-based schedule for the substrates to be processed as defined in a sequence recipe.

Figure 4:
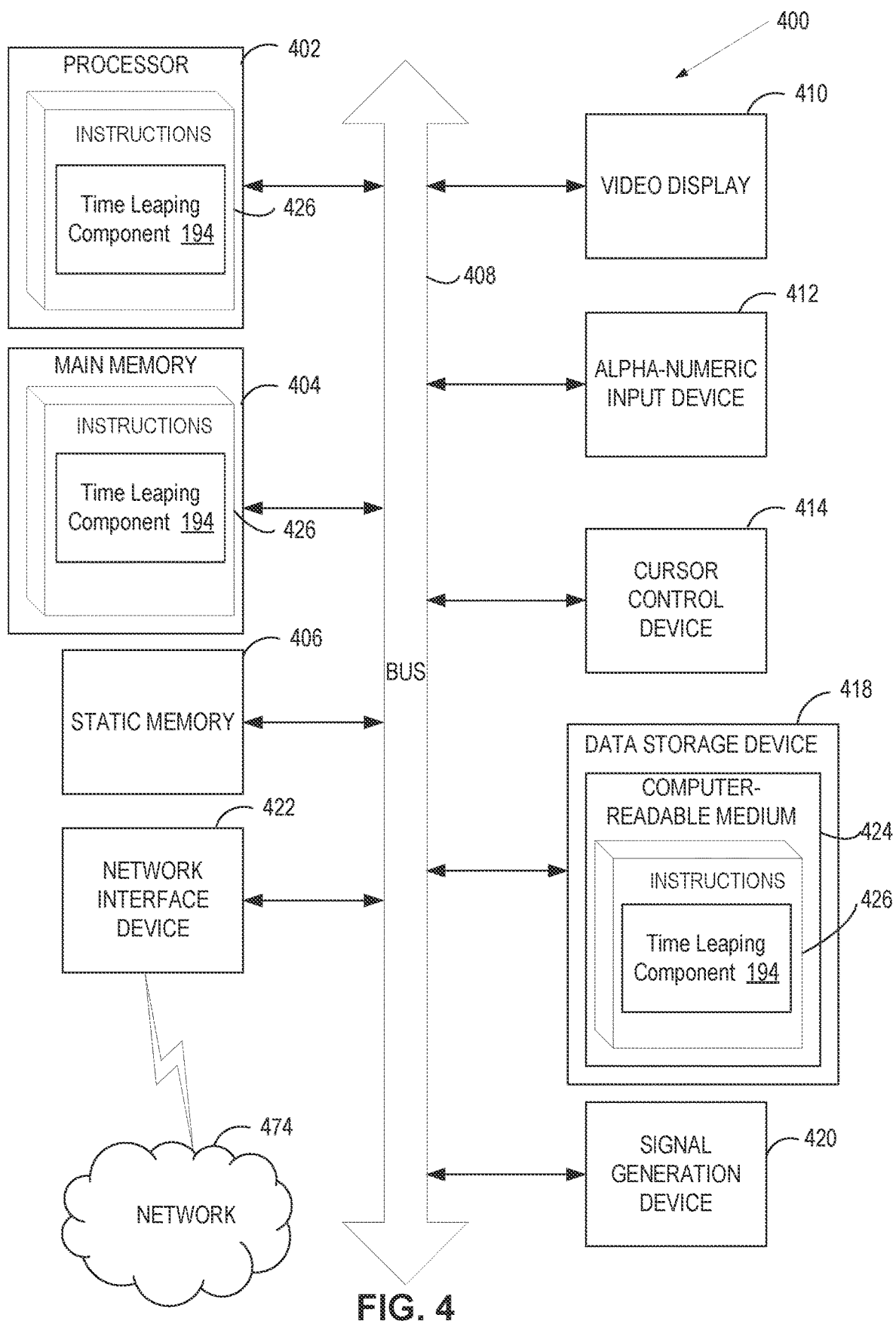
FIG. 4 is a block diagram illustrating a computer system, according to certain embodiments.

FIG. 4 is a block diagram illustrating a computer system 400, according to certain embodiments. In some embodiments, the computer system 400 is the client device 192. In some embodiments, the computer system 400 is the controller device 190 (e.g., server).

In some embodiments, computer system 400 is connected (e.g., via a network, such as a Local Area Network (LAN), an intranet, an extranet, or the Internet) to other computer systems. Computer system 400 operates in the capacity of a server or a client computer in a client-server environment, or as a peer computer in a peer-to-peer or distributed network environment. In some embodiments, computer system 400 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In some embodiments, the computer system 400 includes a processing device 402, a volatile memory 404 (e.g., Random Access Memory (RAM)), a non-volatile memory 406 (e.g., Read-Only Memory (ROM) or Electrically-Erasable Programmable ROM (EEPROM)), and/or a data storage device 416, which communicates with each other via a bus 408.

In some embodiments, processing device 402 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor). In some embodiments, processing device 402 is provided by one or more of a single processor, multiple processors, a single processor having multiple processing cores, and/or the like.

In some embodiments, computer system 400 further includes a network interface device 422 (e.g., coupled to network 474). In some embodiments, the computer system 400 includes one or more input/output (I/O) devices. In some embodiments, computer system 400 also includes a video display unit 410 (e.g., an LCD), an alphanumeric input device 412 (e.g., a keyboard), a cursor control device 414 (e.g., a mouse), and/or a signal generation device 420.

In some implementations, data storage device 416 (e.g., disk drive storage, fixed and/or removable storage devices, fixed disk drive, removable memory card, optical storage, network attached storage (NAS), and/or storage area-network (SAN)) includes a non-transitory computer-readable storage medium 424 on which stores instructions 426 encoding any one or more of the methods or functions described herein, including instructions encoding components of FIG. 1 (e.g., time leaping component 194, etc.) and for implementing methods described herein. In some embodiments, the processor 402 includes time leaping component 194. In some embodiments, a generated schedule is stored in data storage device 418.

In some embodiments, instructions 426 also reside, completely or partially, within volatile memory 404 and/or within processing device 402 during execution thereof by computer system 400, hence, volatile memory 404 and processing device 402 also constitute machine-readable storage media, in some embodiments.

While computer-readable storage medium 424 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICS, FPGAs, DSPs or similar devices. In some embodiments, the methods, components, and features are implemented by firmware modules or functional circuitry within hardware devices. Further, the methods, components, and features are implemented in any combination of hardware devices and computer program components, or in computer programs.

Unless specifically stated otherwise, terms such as "receiving," "identifying," "simulating," "setting," "generating," "causing," "determining," "calculating," "sorting," "obtaining," "prepositioning," "predicting," "running," "storing," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or it includes a general purpose computer system selectively programmed by a computer program stored in the computer system. Such a computer program is stored in a computer-readable tangible storage medium.

The methods and illustrative examples described herein are not inherently related to any particular computer or other apparatus. Various general purpose systems are used in accordance with the teachings described herein, or, in some embodiments, it proves convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

The invention claimed is:

1. A method comprising:
generating, by a processing system comprising a memory and a processing device, a queue of a plurality of operations in a sequence recipe, the plurality of operations being associated with substrate processing;
sorting, by the processing system, the plurality of operations in the queue based on a plurality of completion times corresponding to the plurality of operations; and
for each operation of the plurality of operations in the queue, obtaining a next operation in the queue and setting a virtual time axis to time leap to a corresponding completion time of the next operation until each operation of the plurality of operations in the queue are completed to generate a schedule for the sequence recipe, the method further comprising one or more of:
causing, based on the schedule, one or more processing chambers of a substrate processing system to be prepared for one or more corresponding processing operations; or
causing performance of a corrective action based on the schedule.

2. The method of claim 1, wherein the plurality of operations comprise one or more of a substrate transfer operation, a substrate processing operation, or a cleaning operation.

3. The method of claim 1 further comprising:
determining a corresponding starting time and a corresponding total time of each operation of the plurality of operations; and
calculating a corresponding sum of the corresponding starting time and the corresponding total time of each operation of the plurality of operations to generate the plurality of completion times.

4. The method of claim 1 further comprising:
predicting, based on the schedule, a respective completion time of a first set of substrates at the substrate processing system; and
prepositioning, based on the respective completion time, one or more robots to unload the first set of substrates and to load a second set of substrates at the substrate processing system.

5. The method of claim 1 further comprising:
predicting, based on the schedule, one or more deadlocks in the substrate processing system; and
causing the sequence recipe to be updated to prevent the one or more deadlocks.

6. A non-transitory machine-readable storage medium storing instructions which, when executed cause a processing system comprising a memory and a processing device to:
generate a queue of a plurality of operations in a sequence recipe, the plurality of operations being associated with substrate processing;
sort the plurality of operations in the queue based on a plurality of completion times corresponding to the plurality of operations;
for each operation of the plurality of operations in the queue, obtain a next operation in the queue and set a virtual time axis to time leap to a corresponding completion time of the next operation until each operation of the plurality of operations in the queue are completed to generate a schedule for the sequence recipe, wherein the processing device is further to one or more of:
cause, based on the schedule, one or more processing chambers of a substrate processing system to be prepared for one or more corresponding processing operations; or
cause performance of a corrective action based on the schedule.

7. The non-transitory machine-readable storage medium of claim 6, wherein the plurality of operations comprise one or more of a substrate transfer operation, a substrate processing operation, or a cleaning operation.

8. The non-transitory machine-readable storage medium of claim 6, wherein the processing device is further to:
determine a corresponding starting time and a corresponding total time of each operation of the plurality of operations; and
calculate a corresponding sum of the corresponding starting time and the corresponding total time of each operation of the plurality of operations to generate the plurality of completion times.

9. The non-transitory machine-readable storage medium of claim 6, wherein the processing device is further to:
predict, based on the schedule, a respective completion time of a first set of substrates at the substrate processing system; and preposition, based on the respective completion time, one or more robots to unload the first set of substrates and to load a second set of substrates at the substrate processing system.

10. The non-transitory machine-readable storage medium of claim 6, wherein the processing device is further to:
predict, based on the schedule, one or more deadlocks in the substrate processing system; and
cause the sequence recipe to be updated to prevent the one or more deadlocks.

11. A system comprising:
memory; and
a processing device coupled to the memory, the processing device to:
generate a queue of a plurality of operations in a sequence recipe, the plurality of operations being associated with substrate processing;
sort the plurality of operations in the queue based on a plurality of completion times corresponding to the plurality of operations; and
for each operation of the plurality of operations in the queue, obtain a next operation in the queue and set a virtual time axis to time leap to a corresponding completion time of the next operation until each operation of the plurality of operations in the queue are completed to generate a schedule for the sequence recipe, wherein the processing device is further to one or more of:
cause, based on the schedule, one or more processing chambers of a substrate processing system to be prepared for one or more corresponding processing operations; or
cause performance of a corrective action based on the schedule.

12. The system of claim 11, wherein the plurality of operations comprise one or more of a substrate transfer operation, a substrate processing operation, or a cleaning operation.

13. The system of claim 11, wherein the processing device is further to:
determine a corresponding starting time and a corresponding total time of each operation of the plurality of operations; and
calculate a corresponding sum of the corresponding starting time and the corresponding total time of each operation of the plurality of operations to generate the plurality of completion times.

14. The system of claim 11, wherein the processing device is further to:
predict, based on the schedule, a respective completion time of a first set of substrates at the substrate processing system; and
preposition, based on the respective completion time, one or more robots to unload the first set of substrates and to load a second set of substrates at the substrate processing system.

15. The system of claim 11, wherein the processing device is further to:
predict, based on the schedule, one or more deadlocks in the substrate processing system; and
cause the sequence recipe to be updated to prevent the one or more deadlocks.

* * * * *